(12) United States Patent
Iwata et al.

(10) Patent No.: US 11,733,612 B2
(45) Date of Patent: Aug. 22, 2023

(54) SUBSTRATE PROCESSING APPARATUS AND METHOD OF PROCESSING SUBSTRATE

(71) Applicant: Tokyo Electron Limited, Tokyo (JP)

(72) Inventors: Kazuya Iwata, Koshi (JP); Norihisa Koga, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/703,211

(22) Filed: Mar. 24, 2022

(65) Prior Publication Data

US 2022/0317575 A1    Oct. 6, 2022

(30) Foreign Application Priority Data

Apr. 1, 2021 (JP) ................. 2021-062851

(51) Int. Cl.
*G03F 7/20* (2006.01)
*G03F 7/00* (2006.01)

(52) U.S. Cl.
CPC ................. *G03F 7/70191* (2013.01)

(58) Field of Classification Search
CPC ................................................. G03F 7/70191
See application file for complete search history.

(56) References Cited

U.S. PATENT DOCUMENTS

| 9,383,652 | B2* | 7/2016 | Kajiyama | G03F 7/70191 |
| 10,795,265 | B2* | 10/2020 | Koga | G03F 7/70558 |
| 2020/0409269 | A1* | 12/2020 | Kikai | H01L 21/027 |

FOREIGN PATENT DOCUMENTS

JP    2013186191 A    9/2013

* cited by examiner

*Primary Examiner* — Hung V Nguyen
(74) *Attorney, Agent, or Firm* — Nath, Goldberg & Meyer; Jerald L. Meyer; Tanya E. Harkins

(57) ABSTRACT

A substrate processing apparatus includes light source configured to irradiate a substrate having thereon a resist film made of a resist material for EUV lithography with light including vacuum ultraviolet light before an exposure process, and a light amount suppressing member provided in an optical path of the light from the light source and configured to suppress an amount of the light reaching a surface of the substrate such that the light becomes weak light as a whole in an irradiation region, wherein the light including the vacuum ultraviolet light contains a continuous spectral component of at least a portion of a band contained in a wavelength of 10 nm to 200 nm.

9 Claims, 10 Drawing Sheets

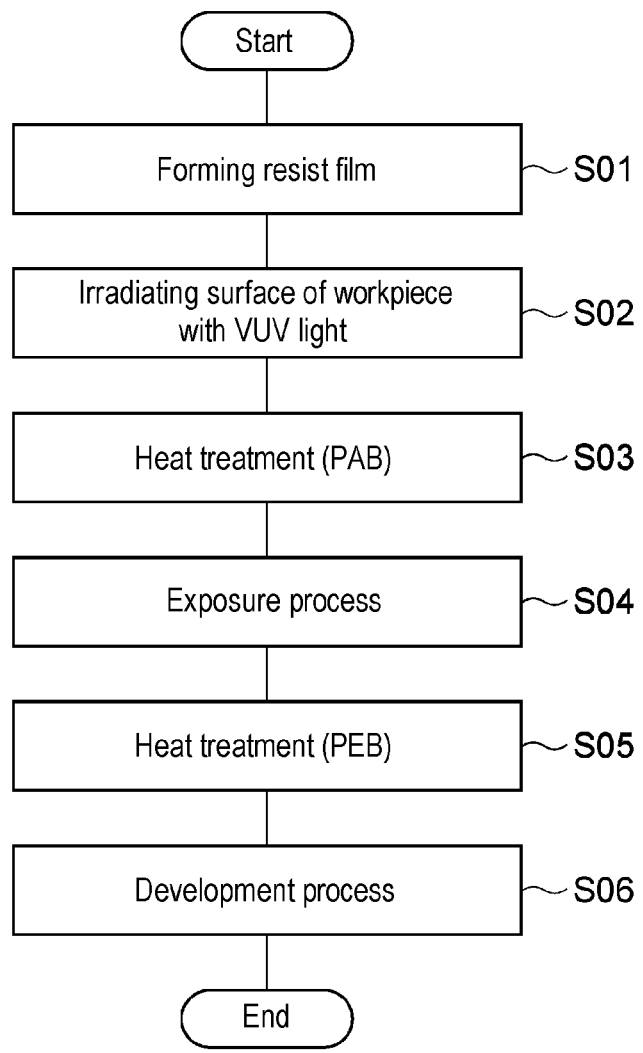

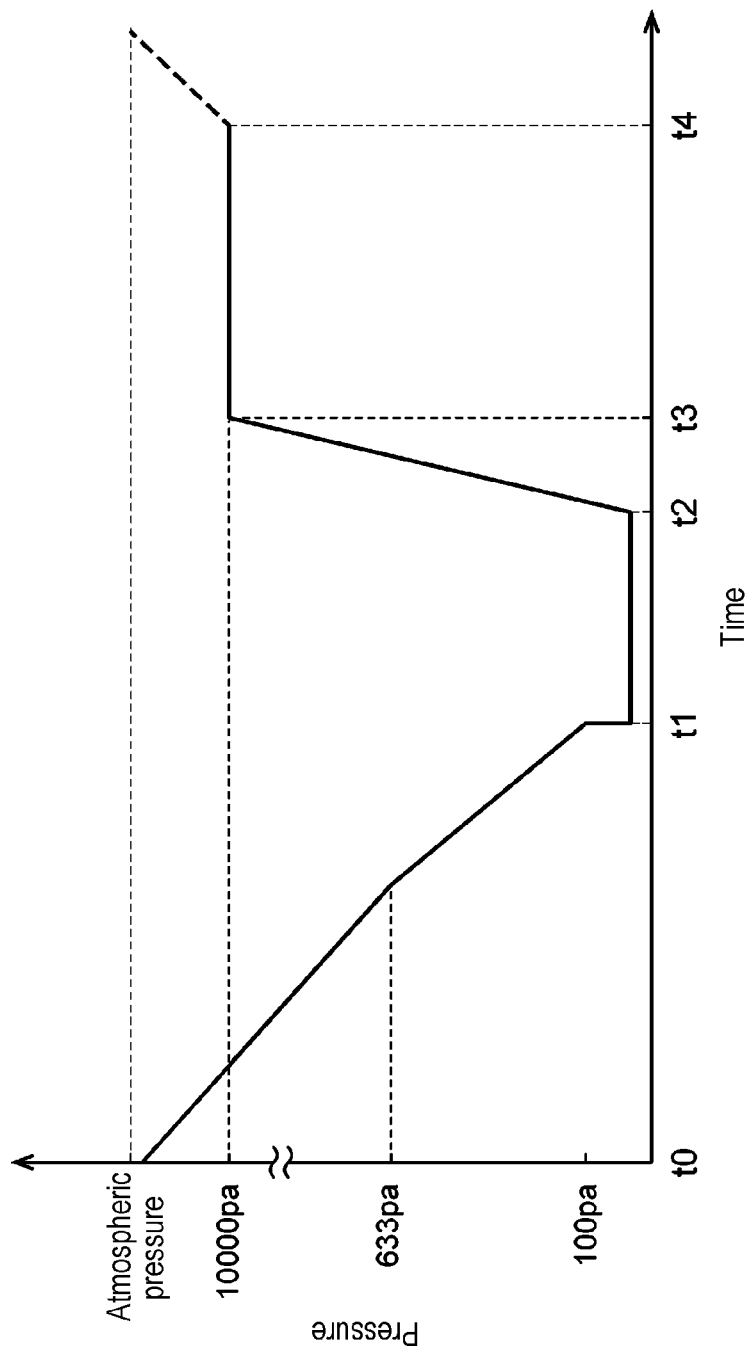

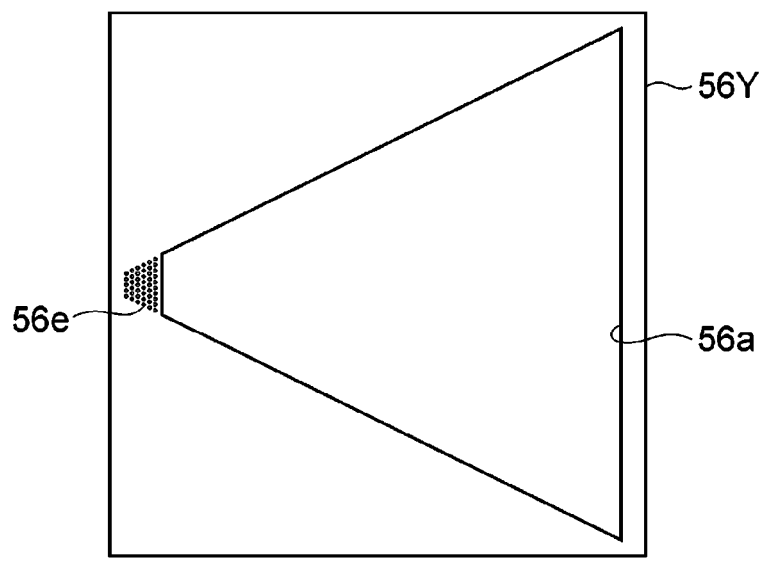
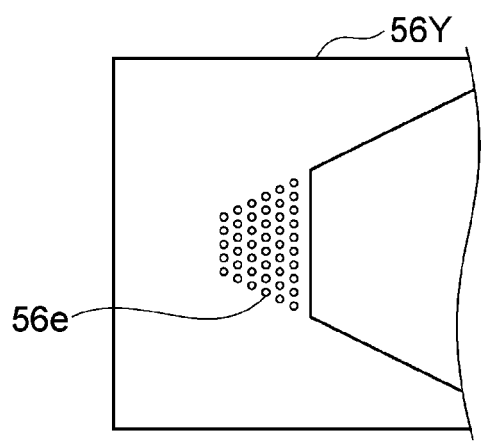

SUBSTRATE PROCESSING APPARATUS AND METHOD OF PROCESSING SUBSTRATE

CROSS-REFERENCE TO RELATED APPLICATION

This application is based upon and claims the benefit of priority from Japanese Patent Application No. 2021-062851, filed on Apr. 1, 2021, the entire contents of which are incorporated herein by reference.

TECHNICAL FIELD

The present disclosure relates to a substrate processing apparatus and a method of processing a substrate.

BACKGROUND

Patent Document 1 discloses an auxiliary exposure apparatus for improving the accuracy of the film thickness or line width of a resist pattern or the in-plane uniformity thereof by irradiating a resist film formed on a substrate with an ultraviolet ray separately from an exposure process.

PRIOR ART DOCUMENT

Patent Document

Japanese laid-open publication No. 2013-186191

SUMMARY

According to one embodiment of the present disclosure, there is provided a substrate processing apparatus including a light source configured to irradiate a substrate having thereon a resist film made of a resist material for EUV lithography with light including vacuum ultraviolet light before an exposure process, and a light amount suppressing member provided in an optical path of the light from the light source and configured to suppress an amount of the light reaching a surface of the substrate such that the light becomes weak light as a whole in an irradiation region, wherein the light including the vacuum ultraviolet light contains a continuous spectral component of at least a portion of a band contained in a wavelength of 10 nm to 200 nm.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a flowchart for explaining an example of a substrate processing method.

FIG. 7 is a diagram showing an example of a pressure change during substrate processing in the substrate processing apparatus.

FIGS. 9A, 9B, and 9C are views showing an example of changing the configuration of the light-shielding plate.

DETAILED DESCRIPTION

Figure 1:
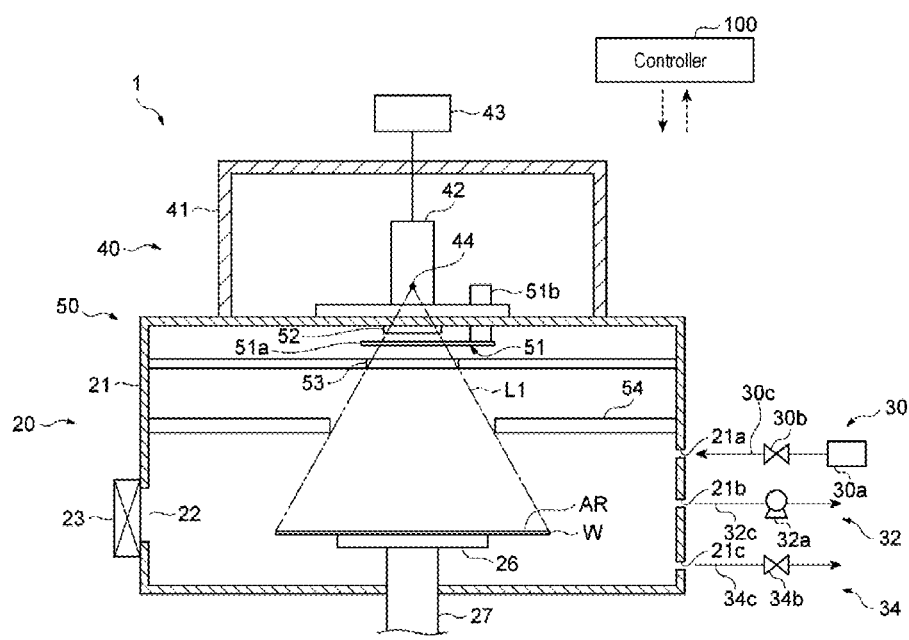
FIG. 1 is a view showing a substrate processing apparatus according to one exemplary embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various exemplary embodiments will be described.

In one exemplary embodiment, substrate processing apparatus includes a light source configured to irradiate a substrate having thereon a resist film made of a resist material for EUV lithography with light including vacuum ultraviolet light before an exposure process, and a light amount suppressing member provided in an optical path of the light from the light source and configured to suppress an amount of the light reaching a surface of the substrate such that the light becomes weak light as a whole in an irradiation region, wherein the light including the vacuum ultraviolet light contains a continuous spectral component of at least a portion of a band contained in a wavelength of 10 nm to 200 nm.

According to the substrate processing apparatus, the irradiation region on the surface of the substrate is irradiated with the light including the vacuum ultraviolet light which is adjusted to the weak light by the light amount suppressing member. Therefore, it is possible to appropriately adjust the sensitivity at the time of exposure of the resist film by irradiating the substrate surface with the light including the vacuum ultraviolet light which is the weak light. As a result, it is possible to make the sensitivity of the substrate at the time of exposure uniform in the plane of the substrate.

The light amount suppressing member may include a perforated plate having a plurality of apertures formed in the thickness direction.

By using the perforated plate as the light amount suppressing member, it is possible to irradiate the substrate with the light including the vacuum ultraviolet light from the light source, as the weak light, without changing the spectral component thereof. Therefore, the sensitivity of the resist film can be appropriately adjusted by the light including the vacuum ultraviolet light.

The light amount suppressing member may include a member that suppresses the amount of light from the light source such that the light becomes the weak light and transmits the weak light.

By using the member that suppresses the amount of light from the light source such that the light becomes the weak light and transmitting the weak light, it is possible to irradiate the substrate with the weak light while maintaining the distribution of the light from the light source. Therefore, the sensitivity of the resist film can be appropriately adjusted by the light including the vacuum ultraviolet light.

The substrate processing apparatus may further include: a substrate support part configured to support the substrate while rotating the substrate when the substrate is irradiated with the light from the light source; and a light-shielding member provided at a position between the light source and the substrate and configured to form the irradiation region on the surface of the substrate which has an area smaller than a surface area of the substrate and increases toward the outer peripheral side of the substrate.

By using the light-shielding member that forms the irradiation region on the surface of the substrate to irradiate the rotating substrate with the light from the light source, it is possible to more uniformly irradiate the entire surface of the substrate with the light from the light source. Therefore, the adjustment of the sensitivity of the resist film by the light including the vacuum ultraviolet light can be appropriately made on the substrate surface.

The light amount suppressing member may form a gradient of light amount so that the irradiation intensity of light per unit area becomes larger in the outer peripheral portion than the central portion in the irradiation region.

When irradiating the rotating substrate with the light from the light source, by forming the gradient of the light amount so that the irradiation intensity of light per unit area becomes larger in the outer peripheral portion of the irradiation region than in the central portion thereof, since a difference in the light amount, which is derived from a difference in the circumferential speed between the central portion of the substrate and the outer peripheral portion thereof, can be adjusted, it is possible to more uniformly irradiate the substrate with the light from the light source.

The light amount suppressing member may include a perforated plate having a plurality of apertures formed in the thickness direction, and the gradient of the light amount may be formed by making the aperture ratio of the outer peripheral portion larger than the aperture ratio of the central portion.

As described above, when the gradient of the light amount is formed by making the aperture ratio of the perforated plate larger in the outer peripheral portion than in the central portion, a difference in the light amount between the central portion of the substrate and the outer peripheral portion thereof can be adjusted with a simpler configuration.

The light-shielding member may have no aperture formed at a position overlapping the center of the substrate in a plan view.

The light from the light source also diffuses below the light-shielding member. Therefore, by not forming an aperture of the light-shielding member at the position overlapping the center of the substrate in a plan view, it is possible to prevent the light from the light source from concentrating at the center of the substrate.

The light source may have an optical axis inclined with respect to the surface of the substrate.

When the optical axis of the light source is inclined with respect to the surface of the substrate, it is possible to irradiate the substrate surface with the light including the vacuum ultraviolet light, which is the weak light, while reducing a distance between the light source and the substrate. Therefore, the adjustment of the sensitivity at the time of exposure of the resist film can be appropriately made.

In one exemplary embodiment, a method of processing a substrate, includes irradiating a substrate having thereon a resist film made of a resist material for EUV lithography with light including vacuum ultraviolet light from a light source before an exposure process, and suppressing an amount of light reaching a surface of the substrate such that the light becomes weak light as a whole in an irradiation region by a light amount suppressing member provided in an optical path of the light from the light source in the irradiating the substrate, wherein the light including the vacuum ultraviolet light contains a continuous spectral component of at least a portion of a band contained in a wavelength of 10 nm to 200 nm.

According to the substrate processing method, the surface of the substrate is irradiated with the light including the vacuum ultraviolet light which is adjusted to the weak light in the irradiation region by the light amount suppressing member. Therefore, it is possible to appropriately adjust the sensitivity at the time of exposure of the resist film by irradiating the substrate surface with the light including the vacuum ultraviolet light which is the weak light. As a result, it is possible to make the sensitivity of the substrate at the time of exposure uniform in the plane of the substrate.

The method may further includes supporting the substrate while rotating the substrate in the irradiating the substrate, and forming, on the surface of the substrate, the irradiation region having the area smaller than the surface area of the substrate and increasing toward the outer peripheral side of the substrate, by a light-shielding member provided at a position between the light source and the substrate, in the irradiating the substrate.

By using the light-shielding member that forms the irradiation region on the surface of the substrate to irradiate the rotating substrate with the light from the light source, it is possible to more uniformly irradiate the entire surface of the substrate with the light from the light source. Therefore, the adjustment of the sensitivity of the resist film by the light including the vacuum ultraviolet light can be appropriately made on the substrate surface.

Hereinafter, various exemplary embodiments will be described in detail with reference to the drawings. Throughout the drawings, the same or equivalent parts are denoted by the same reference numerals.

[Configuration of Substrate Processing Apparatus]

First Configuration Example

FIG. 1 is a schematic view (longitudinal side sectional view) showing a first configuration example of a substrate processing apparatus according to an embodiment. The substrate processing apparatus 1 shown in FIG. 1 irradiates a workpiece W with light for processing. For example, the substrate processing apparatus 1 is configured to irradiate a resist film or a resist pattern formed on the surface of the workpiece W with light including vacuum ultraviolet (VUV) light. By the irradiation of the workpiece W with the light including the vacuum ultraviolet light by the substrate processing apparatus 1, the sensitivity of the resist film at the time of exposure can be improved. Further, by the irradiation of the workpiece W with the light including the vacuum ultraviolet light, the roughness of the surface of the resist pattern obtained by an exposure/development process can also be improved.

The workpiece W to be processed is, for example, a substrate or a substrate in which a film, a circuit, and the like are formed by being subjected to a predetermined process. The substrate included in the workpiece W is, for example, a wafer containing silicon. The workpiece W (substrate) has a disc shape as an example, but a portion of the circle shape may be cut out or may have a shape such as a polygonal shape other than the circle shape. The workpiece W to be processed may be a glass substrate, a mask substrate, a FPD (Flat Panel Display), or the like, or may be an intermediate obtained by subjecting these substrates and the like to a predetermined process.

The substrate processing apparatus 1 has a function of irradiating the surface of the workpiece W with light L1 for processing. As an example, a predetermined resist pattern is formed by forming a resist film on a SOC film (Silicon-on-Carbon) on a substrate and a SOG film (Silicon-on-Glass) on the SOC film, and then performing an exposure/development process. The resist pattern is a mask pattern for etching the SOC film and the SOG film, which are lower layer films, to form a pattern on these lower layer films. The substrate processing apparatus 1 has a function of improving the roughness of the surface of the resist pattern by, for example, irradiating the surface of the workpiece W on which the resist pattern is formed, with the light L1 for processing. On the other hand, in the present embodiment, a case where the workpiece W after forming a resist film and before performing an exposure/development process is irradiated with the light L1 for processing by the substrate processing apparatus 1 will be described.

Further, in the substrate processing apparatus 1 according to the present embodiment, a case where a resist material used for forming the resist pattern is a material suitable for EUV lithography using an EUV laser as an exposure light source will be described. The EUV (Extreme Ultraviolet) laser is a laser having a wavelength of 13.5 nm. The workpiece W on which the resist film made of the resist material is formed is irradiated with light including the above-mentioned VUV light under predetermined conditions using the substrate processing apparatus 1. As a result, the sensitivity in the subsequent exposure process is improved. Further, the roughness of the surface of the resist when the resist pattern is formed by the exposure/development process is improved. Further, the surface roughness of a pattern as a result of etching using this resist pattern as a mask can be improved.

Each part of the substrate processing apparatus 1 will be described. As shown in FIG. 1, the substrate processing apparatus 1 includes a process chamber 20, a light irradiation mechanism (light source part) 40, a light amount adjusting mechanism 50, and a controller (control part) 100.

The process chamber 20 includes a housing (process container) 21, a transfer port 22, a rotation/support part 25, a gas supply part 30, a gas discharge part 32, and an atmosphere adjusting part 34. The housing 21 is, for example, a portion of a vacuum container provided in the air atmosphere and is configured to be able to accommodate the workpiece W transferred by a transfer mechanism (not shown). That is, the housing 21 functions as a process container that internally performs processes on the workpiece W. As will be described later, the inside of the housing 21 may be separated into an upper region and a lower region by a light-transmitting plate 53.

In the substrate processing apparatus 1, the process on the workpiece W is performed with the workpiece W accommodated in the housing 21. The transfer port 22 is formed on a sidewall of the housing 21. The transfer port 22 is an opening for loading/unloading the workpiece W into/from the housing 21. The transfer port 22 is opened/closed by a gate valve 23.

The rotation/support part 25 has a function of holding the workpiece W while rotating it in the housing 21 based on an instruction of the controller 100. The rotation/support part 25 has, for example, a holding part 26 and a rotation drive part 27. The holding part 26 supports the central portion of the workpiece W arranged horizontally with the surface formed with the resist pattern facing up, and holds the workpiece W by, for example, vacuum suction. The rotation drive part 27 has a function of rotating the holding part 26 holding the workpiece W together with the workpiece W around a vertical axial line A1. The rotation drive part 27 is, for example, a rotary actuator powered by an electric motor.

The gas supply part 30 is configured to supply an inert gas (for example, argon, nitrogen, etc.) into the housing 21 through a through-hole 21a formed in the housing 21. The gas supply part 30 has a gas source 30a, a valve 30b, and a pipe 30c. The gas source 30a stores the inert gas and functions as a supply source of the inert gas. The valve 30b operates based on an operation signal from the controller 100 to open/close the pipe 30c. The pipe 30c connects the gas source 30a, the valve 30b, and the through-hole 21a sequentially from the upstream side.

The gas discharge part 32 discharges a gas from the housing 21 through a through-hole 21b formed in the housing 21. The gas discharge part 32 has a vacuum pump 32a and a pipe 32c. The vacuum pump 32a discharges the gas from the inside of the housing 21. The pipe 32c connects the through-hole 21b to the vacuum pump 32a.

The atmosphere adjusting part 34 can adjust the inside of the housing 21 to the air atmosphere through a through-hole 21c formed in the housing 21. The atmosphere adjusting part 34 has a valve 34b and a pipe 34c. The valve 34b operates based on an operation signal from the controller 100 to open/close the pipe 34c. The pipe 34c can connect the through-hole 21c to the air atmosphere. That is, when the valve 34b is opened, the inside of the housing 21 is adjusted to the air atmosphere.

The light irradiation mechanism 40 includes a housing 41, a light source 42, and a switch 43. The housing 41 is provided on the housing 21. The light source 42 is accommodated in the housing 41. In FIG. 1, the light source 42 is arranged on the axial line A1 which is a rotation axis of the holding part 26. The light source 42 irradiates the entire surface of the workpiece W held by the holding part 26 with light. The switch 43 may be provided to switch the lighting-on/off of the light source 42. The operation of the switch 43 is controlled by, for example, the controller 100. The arrangement of the light source 42 is an example, and may be changed as appropriate. Although the details will be described later, the amount of light with which the workpiece W is irradiated may be adjusted by adjusting the positional relationship between the light source 42 and the workpiece W.

The light source 42 emits light in a wavelength range of, for example, 115 nm to 400 nm. As an example, the light source 42 emits light having a continuous spectrum of 115 nm to 400 nm. The "light having a continuous spectrum" may include light containing continuous spectrum components of at least a portion (for example, a wavelength width of 10 nm or more) of a band contained in a wavelength range of 10 nm to 200 nm (corresponding to a wavelength range of vacuum ultraviolet light (VUV light). Further, the light emitted from the light source 42 may include near-ultraviolet light (near ultraviolet ray) having a wavelength larger than that of the VUV light, in addition to the VUV light. As an example, the light from the light source 42 can be configured to include light in a band having a wavelength of 160 nm or less. In this way, the light emitted from the light source 42, including at least the VUV light, may be referred to as "light including VUV light."

The light source 42 is, for example, a deuterium lamp and may be configured to emit VUV light having a wavelength of 200 nm or less. The wavelength of the peak of the continuous spectrum may be, for example, 160 nm or less and 150 nm or more. Further, the light from the light source 42 may be light having a continuous spectrum having a plurality of sub peaks. The light from the light source 42 is not limited to the continuous spectrum, and includes light having one or more wavelengths in the wavelength range of, for example, 115 nm to 400 nm. "Including light in a specific wavelength range" refers to including light having one or more wavelengths included in the wavelength range.

Since the wavelength range of the spectrum of the light emitted from the light source 42 is relatively wide, the resist film on the workpiece W receives the energy of light of various wavelengths. As a result, various reactions occur on the surface of the resist film. Specifically, the sensitivity of the resist film to exposure is increased by cleaving the chemical bonds at various positions in molecules constituting the resist film. Therefore, even if the exposure amount is smaller, the exposure is appropriately performed. In addition, since various compounds are generated by the cleavage of the above-mentioned chemical bonds, the orientation of the molecules existing in the resist film before light irradiation is eliminated. As a result, the surface free energy in the resist film is reduced so that an internal stress is reduced. That is, by using the light source 42 as a light source, the fluidity of the surface of the resist film tends to be high, and as a result, the effect of improving the roughness of the surface of the resist pattern when the resist pattern is formed is increased.

When the workpiece W is irradiated with the light including VUV light from the light source 42, if the energy of the light received by the resist film on the workpiece W is biased, the characteristics of the resist may be biased on the surface of the workpiece W irradiated with the VUV light. Therefore, the workpiece W is required to be irradiated with the light including the VUV light as evenly as possible on the entire surface of the workpiece W. Further, when trying to adjust the characteristics of the resist film on the surface of the workpiece W by irradiating the workpiece W with the light from the light source 42, the amount of irradiation of the workpiece W with the light may be important. Therefore, in the substrate processing apparatus 1, the light amount is adjusted by using the light amount adjusting mechanism 50.

As described above, the light amount adjusting mechanism 50 has a function of adjusting the amount of light emitted from the light source 42 in an optical path of the light L1 emitted from the light source 42. In the example shown in FIG. 1, the light amount adjusting mechanism 50 includes a shutter 51, a perforated plate 52, a light-transmitting plate 53, and a light-shielding plate 54.

The shutter 51 has a function of switching between a state in which the light L1 from the light source 42 reaches the workpiece W and a state in which the light L1 does not reach the workpiece W. The shutter 51 has, for example, a shielding plate 51a that can be arranged in the optical path of the light L1, and a support part 51b that movably supports the shielding plate 51a. The shielding plate 51a has a size capable of blocking all the light L1 from the light source 42. Further, the support part 51b movably supports the shielding plate 51a between the optical path and a region other than the optical path, for example in a state where the shielding plate 51a is orthogonal to the optical axis of the light L1. By moving the shielding plate 51a by the support part 51b, it is possible to switch between a state in which the light L1 from the light source 42 reaches the workpiece W and a state in which the light L1 does not reach the workpiece W. FIG. 1 shows a state in which the shielding plate 51a is arranged on the optical path.

Figure 2:
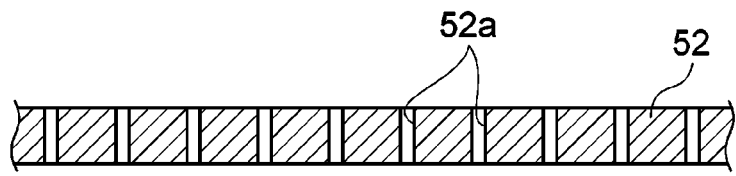
FIG. 2 is a view showing an example of a perforated plate in the substrate processing apparatus.

The perforated plate 52 is provided on the optical path of the light L1 emitted from the light source 42 and has a function of dimming the light L1 from the light source 42. That is, the perforated plate 52 can function as a light amount suppressing member. The perforated plate 52 is, for example, a plate in which a plurality of apertures 52a are formed in the thickness direction, as shown in FIG. 2. Specifically, for example, a punching metal formed with a large number of apertures can be used as the perforated plate 52. It is not necessary that a plurality of apertures are provided on the entire surface of the perforated plate 52, and the apertures may be provided so that the perforated plate 52 can have its function at least in a range where the workpiece W is irradiated with the light L1. The aperture ratio of the perforated plate 52 (aperture ratio in the irradiation range of the light L1) can be, for example, about 1% to 50%. The shape and size of the apertures provided in the perforated plate 52 are not particularly limited. For example, a perforated plate 52 can be selected which allows that the light L1 having passed through the perforated plate 52 has about the same wavelength distribution as the light before passing through the perforated plate 52, and the intensity of the light L1 is weakened as a whole.

The light-transmitting plate 53 is provided below the shutter 51 (on the side far from the light source 42) and also has a function as a so-called partition wall for transmitting the light L1. That is, the light-transmitting plate 53 is arranged so as to partition an inner space of the housing 21 into the light source 42 side and the workpiece W side. As a result, a space below the light-transmitting plate 53 becomes a closed space independent of a space above the light-transmitting plate 53. When the gas supply part 30, the gas discharge part 32, and the atmosphere adjusting part 34 are arranged below the light-transmitting plate 53, it is possible to appropriately adjust the atmosphere in a space where the workpiece W is placed below the light-transmitting plate 53. The light-transmitting plate 53 may be, for example, glass (for example, magnesium fluoride glass). Further, the entire light-transmitting plate 53 does not have to be substantially 100% transparent to the light L1, and it suffices as long as the entire light-transmitting plate 53 can transmit the light L1 at least in the optical path of the light L1. Further, by using a material that attenuates the light L1, as the light-transmitting plate 53, the light-transmitting plate 53 may also be configured to have a function as a light amount suppressing member.

The light-shielding plate 54 has a function as a light-shielding member that adjusts the irradiation range of the light L1 emitted from the light source 42 (a reachable range of the light L1 on the surface of the workpiece W). In the example shown in FIG. 1, the irradiation range of the light L1 is adjusted by the light-shielding plate 54 so that the light L1 from the light source 42 reaches the entire surface of the workpiece W. The shape of the light-shielding plate 54 can be changed by the arrangement of the light source 42 with respect to the workpiece W. Further, the irradiation range of the light L1 on the surface of the workpiece W is referred to as an irradiation region AR. In the example shown in FIG. 1, the entire surface of the workpiece W is the irradiation region AR.

The light L1 emitted from the light source 42 passes through the light amount adjusting mechanism 50 to be suppressed in the amount of light, resulting in weak light. In the present embodiment, the "weak light" means light such that a change in the temperature of the workpiece W when the workpiece W is irradiated with the light is suppressed to 1 degree C. or less with respect to the external temperature (temperature outside the housing 21, or room temperature). Further, the light L1 after passing through the light amount adjusting mechanism 50 can be adjusted to the weak light in the entire irradiation region AR of the light L1 on the surface of the workpiece W.

Second Configuration Example

Next, a substrate processing apparatus 1A according to a second configuration example in which the arrangement of the light source 42 is changed will be described with reference to FIG. 3.

In the substrate processing apparatus 1A, on the premise that the workpiece W is rotated by the rotation/support part 25, the irradiation position of the light source 42 is a portion of the workpiece W, instead of the entire workpiece W. Specifically, an optical axis A2 of the light source 42 is arranged to move outward along the radial direction of the workpiece W with respect to a rotation axis A1 of the workpiece W. In the example shown in FIG. 3, the optical axis A2 is moved to such an extent that the vicinity of the center of the workpiece W and one end of the workpiece W (the right end portion in FIG. 3) can be irradiated with the light L1 from the light source 42. In this case, since the entire surface of the workpiece W is not irradiated with the light L1 from the light source 42, a distance between the light source 42 and the workpiece W can be shortened.

A distance between the rotation axis A1 and the optical axis A2 of the workpiece W depends on the distance between the light source 42 and the workpiece W, but for example, it is conceivable to adjust the distance between the rotation axis A1 and the optical axis A2 to about 10% to 100% of the radius of the workpiece W.

In addition, when trying to uniformly irradiate the entire surface of the workpiece W with the light from the light source 42 with the configuration of the substrate processing apparatus 1A, it is particularly required to adjust the shape of a light-shielding plate 56 to adjust the amount of irradiation of the workpiece W with the light from the light source 42.

Figure 3:
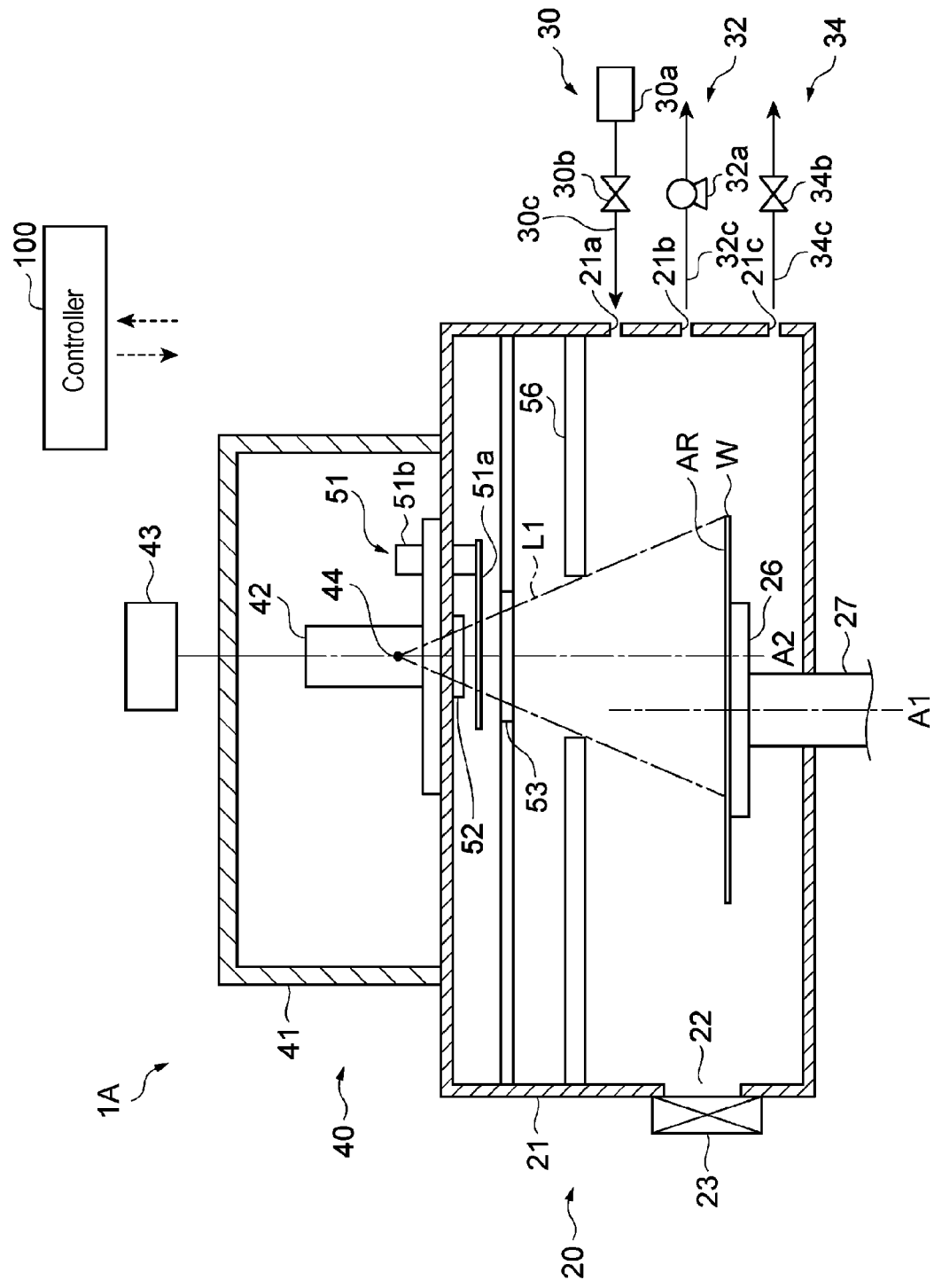
FIG. 3 is a view showing an example of a modification of the substrate processing apparatus.
Figure 4:
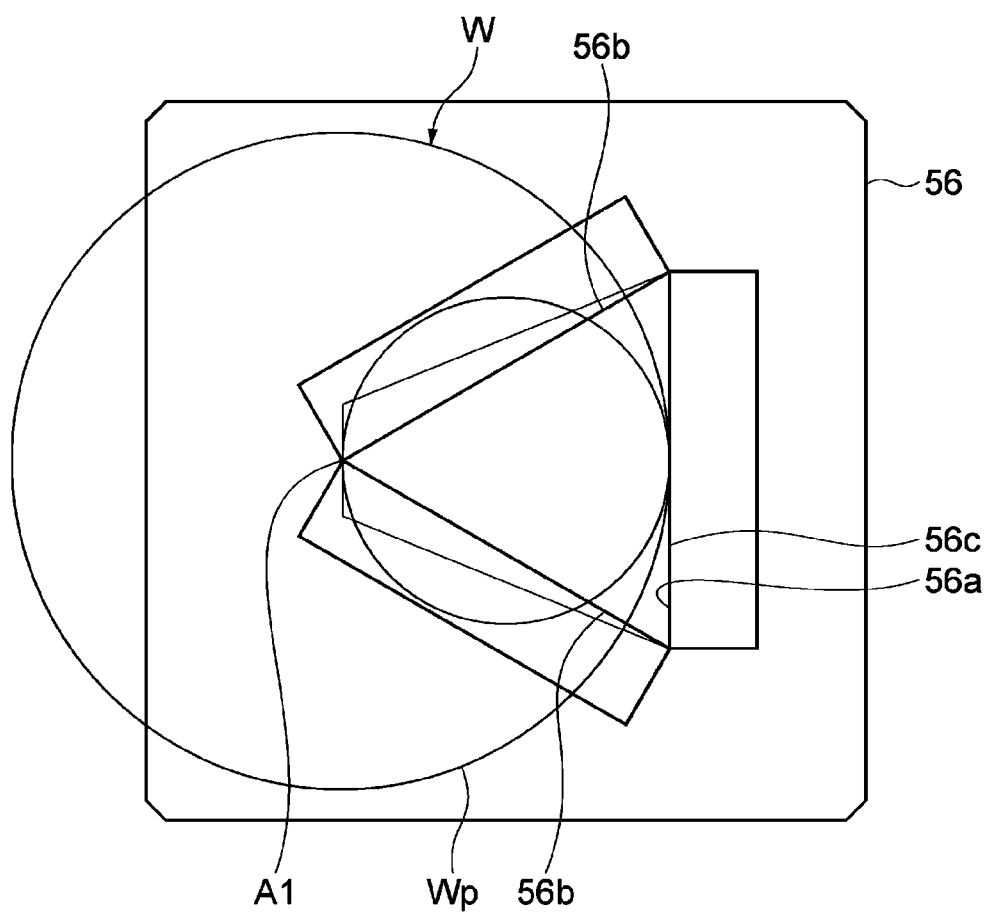
FIG. 4 is a view showing an example of a light-shielding plate in the substrate processing apparatus.

FIG. 4 shows an example of the shape of the light-shielding plate 56 that can be used in the substrate processing apparatus 1A. The light-shielding plate 56 is configured to include an aperture 56a through which the light from the light source 42 passes. At this time, the aperture 56a may be, for example, an isosceles triangle having two sides 56b and 56b of equal length extending in the radial direction of the workpiece W, with the axial line A1 of the holding part 26 corresponding to the center of the workpiece W as an apex angle in a plan view. In this case, the lengths of the two equal-length sides 56b are set so that the base 56c of the isosceles triangle is located beyond the peripheral edge Wp of the workpiece W. In the example of FIG. 4, the base 56c is positioned so as to overlap the peripheral edge Wp of the workpiece W. However, in reality, as shown in FIG. 3 and the like, since the light L1 diffuses even below the light-shielding plate 56, the shape and size of the aperture 56a are set according to the arrangement of the light-shielding plate 56.

When the workpiece W is irradiated with the light L1 from the light source 42 while rotating the workpiece W at a predetermined rotation speed (angular velocity) by the rotation/support part 25, a circumferential speed at the peripheral edge of the workpiece W becomes larger than a speed at the vicinity of the center of the workpiece W. In consideration of this point, as shown in FIG. 4, the shape and size of the light-shielding plate 56 can be set so that the irradiation region of the light from the light source 42 is widened from the center of the workpiece W toward the peripheral edge Wp of the workpiece W. With such a shape, the irradiation region AR (see FIG. 3) on the workpiece W has substantially a triangular shape.

FIG. 3 shows an example in which the irradiation region AR of the light L1 is set in a somewhat wide range including the center of the workpiece W. The irradiation region may be adjusted so that the intensity of the light with which the surface of the workpiece W is irradiated becomes uniform according to the intensity distribution and the like of the light emitted from the light source 42.

By adjusting the irradiation area AR, it is possible to more uniformly adjust the amount of light L1 with which each position on the surface of the workpiece W is irradiated. Therefore, the irradiation region AR may be adjusted according to the light amount distribution of the light emitted from the light source 42.

(Controller)

The controller 100 of the substrate processing apparatus 1 controls the rotation/support part 25, the gas supply part 30, the gas discharge part 32, the atmosphere adjusting part 34, the light irradiation mechanism 40, and the light amount adjusting mechanism 50 (particularly, the shutter 51).

Figure 5:
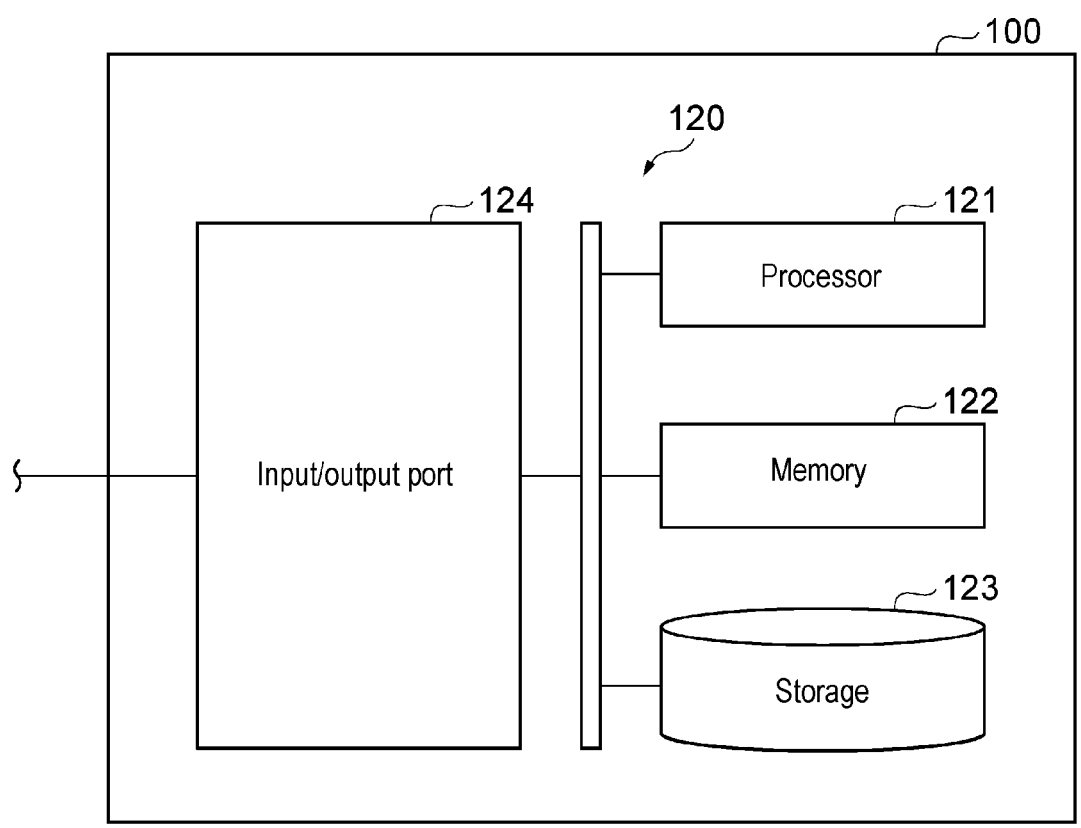
FIG. 5 is a block diagram illustrating a hardware configuration of a controller.

Further, the controller 100 is configured by one or more computers for control. For example, the controller 100 has a circuit 120 shown in FIG. 5. The circuit 120 includes one or more processors 121, a memory 122, a storage 123, and an input/output port 124. The storage 123 has a non-transitory computer-readable storage medium such as a hard disk. The storage medium stores a program for causing the substrate processing apparatus 1 to execute a substrate processing procedure to be described later. The storage medium may be a removable medium such as a non-volatile semiconductor memory, a magnetic disk, or an optical disc. The memory 122 temporarily stores the program loaded from the storage medium of the storage 123 and a result of calculation by the processor 121. The processor 121 constitutes each of the above-mentioned functional modules by executing the above program in cooperation with the memory 122. The input/output port 124 inputs/outputs electric signals to/from each part controlled by the controller 100 according to a command from the processor 121.

The hardware configuration of the controller 100 is not necessarily limited to the one that configures each functional module by a program. For example, each functional module of the controller 100 may be configured by a dedicated logic circuit or an ASIC (Application Specific Integrated Circuit) that integrates the logic circuit.

[Substrate Processing Method]

Next, a substrate processing method including the operations in the substrate processing apparatus will be described. In the substrate processing method shown in the present embodiment, the workpiece W on which the resist film is formed is irradiated with the light including the VUV light before exposure by using the substrate processing apparatus 1 (or the substrate processing apparatus 1A).

FIG. 6 shows a flowchart of a procedure for forming a resist pattern for a workpiece W.

In step S01, a resist liquid is coated on the surface of the workpiece W to form a resist film. A method of forming the resist film is not particularly limited. An underlayer film or the like may be formed on the surface of the workpiece W before the resist film is formed. At this step, the resist film is formed on the entire surface of the workpiece W.

In step S02, the surface of the workpiece W on which the resist film is formed is irradiated with light including VUV light by using the substrate processing apparatus 1. The workpiece W held by the housing 21 is irradiated with the light L1 from the light source 42 as the VUV light. The light L1 is light including the VUV light. In the following embodiment, the "light L1 including the VUV light" emitted from the light source 42 may be simply referred to as the "VUV light." Hereinafter, the operation of the substrate processing apparatus 1 in step S02 will be described.

FIG. 7 is a graph showing the outline of a change in the pressure inside the housing 21 over time. In addition, the "inside the housing 21" refers to a space in which the workpiece W is placed (a lower space in which the workpiece W is placed, of a space partitioned by the light-transmitting plate 53). In the graph of FIG. 7, the horizontal axis represents the elapsed time during processing and the vertical axis represents a pressure (unit: Pa) inside the housing 21 serving as a process container, with a logarithmic axis schematically shown.

First, in a state where the operations of the gas supply part 30 and the gas discharge part 32 are stopped, the workpiece W is loaded into the housing 21 by the transfer mechanism. When the workpiece W is placed on the holding part 26 of the rotation/support part 25, the gate valve 23 is closed to make the inside of the housing 21 airtight. At this time, the inside of the housing 21 is, for example, the air atmosphere of standard atmospheric pressure (time t0 in FIG. 7). After that, the pressure inside the housing 21 is reduced by the operation of the gas discharge part 32.

When the pressure reduction progresses and the pressure inside the housing 21 reaches 1 Pa (time t1), the pressure is maintained for a predetermined time. After maintaining the pressure reduction state of 1 Pa for a while (time t2), the valve 30b of the gas supply part 30 is opened to supply an Ar gas into the housing 21. As a result, the Ar gas atmosphere is formed in the housing 21, and the pressure inside the housing 21 rises. The pressure reduction rate and the pressure increase rate can be controlled by the operation of the gas supply part 30 and the gas discharge part 32. Further, the pressure reduction rate and the pressure increase rate may be constant or may be changed on the way.

For example, when the pressure inside the housing 21 reaches 10,000 Pa due to the Ar gas, the workpiece W is irradiated with the light including the VUV light from the light source 42 while maintaining the pressure inside the housing 21 (time t3). At this time, when it is assumed that the workpiece W is irradiated with the light including the VUV light while rotating the workpiece W, as in the substrate processing apparatus 1A, the irradiation is performed in a state where the workpiece W is rotated by the rotation/support part 25. When the light from the light source 42 reaches the entire workpiece W, as in the substrate processing apparatus 1, the workpiece W does not have to be rotated. After the workpiece W is irradiated with the light from the light source 42 for a predetermined time, for example, 30 seconds, the light irradiation is stopped (time t4). After that, the operations of the gas supply part 30 and the gas discharge part 32 are stopped, the pressure inside the housing 21 is returned to the air atmosphere, and then the workpiece W is unloaded from the housing 21. From the above, the processing of the workpiece W by the substrate processing apparatus 1 is completed.

The amount of light per unit area (sometimes referred to as integrated irradiation amount, or radiation dose) at the time of irradiation of the workpiece W with the light including the VUV light is smaller than that in the case where the surface of the workpiece W is irradiated with the light including the VUV light after irradiation of the resist pattern. Specifically, the irradiation amount of the light including the VUV light is adjusted to 1% to 2% as compared with the case where after the resist pattern is formed by the exposure/development process, the surface of the workpiece W is irradiated with the light including the VUV light to improve the roughness of the surface of the workpiece W. For example, when irradiating the resist pattern with the light including the VUV light, the amount of light including the VUV light can be adjusted to 25 $mj/cm^2$ to 100 $mj/cm^2$. On the other hand, when the resist film before the exposure process is irradiated with the light including the VUV light, the amount of light including the VUV light can be adjusted to about 1 $mj/cm^2$ to 2 $mj/cm^2$. In this way, when the resist film before the exposure process is irradiated with the light including the VUV light, the amount of light of the irradiation light can be adjusted to be small.

During the irradiation of the workpiece W with the light including the VUV light, the temperature rise of the workpiece W may be suppressed. As described above, when the amount of light including the VUV light is adjusted to be small and the pressure inside the housing 21 is adjusted to be smaller than the atmospheric pressure, the temperature rise of the workpiece W itself is prevented. Therefore, the irradiation of the workpiece W with the light including the VUV light can be performed in a state where the temperature of the workpiece W is substantially equal to the ambient temperature (for example, the temperature outside the housing 21). When the irradiation is performed in a state where the temperature of the workpiece W is substantially equal to the (external) ambient temperature, the characteristics of the resist film is prevented from being changed due to the influence of a change in the temperature of the workpiece W. As an example, the change in the temperature of the workpiece W at the time of irradiation of the workpiece W with the light including the VUV light may be suppressed to less than 1 degree C. with respect to the external temperature (temperature outside the housing 21, or room temperature).

An example of a method of reducing the irradiation amount of light per unit area of the workpiece W may include reducing the amount of light itself emitted from the light source 42 (adjusting a current value). Other examples of the method of reducing the irradiation amount may include known methods such as increasing a distance between the surface of the workpiece W and the light source 42 (adjusting the light source 42 so as to be far from the workpiece W), and shortening the irradiation time. The energy of the light reaching the surface of the workpiece W can be adjusted by changing a distance between the surface of the workpiece W and the light source 42 and also changing a pressure around an optical path during the irradiation of the workpiece W with the light from the light source 42. These methods may be combined to change the irradiation amount of light including the VUV light per unit area.

In the substrate processing apparatus 1, the perforated plate 52 also contributes to the adjustment of the irradiation amount of light per unit area of the workpiece W. Since the amount of light from the light source 42 decreases according to the aperture ratio of the perforated plate 52, the irradiation amount of light per unit area of the workpiece W becomes small. Further, in the substrate processing apparatus 1A, in addition to the perforated plate 52, the shape of the light-shielding plate 54 also contributes to the adjustment of the irradiation amount of light per unit area of the workpiece W.

Further, as described above, in the substrate processing apparatus 1, when the workpiece W is irradiated with the light from the light source 42, the gas supply part 30 supplies a gas and the gas discharge part 32 discharges the gas. Therefore, it can be said that the Ar gas is replaced while the pressure inside the housing 21 is maintained.

During the irradiation of the workpiece W with the light from the light source 42 (between time t3 and time t4), the pressure inside the housing 21 may be constant or may be gradually changed. In the example shown in FIG. 6, the pressure inside the housing 21 is set to 10,000 Pa in order to suppress degas (out gas) from the surface of the workpiece W while irradiating the workpiece W with the light from the light source 42. However, it is conceivable that the amount of degas generated gradually decreases while irradiating the workpiece W with the light from the light source 42. In this case, control may be performed to gradually change the pressure inside the housing 21 to a small value. With such a configuration, it is possible to irradiate the workpiece W with the light in a state closer to a vacuum.

In step S03, heat treatment is performed on the workpiece W after the irradiation with the light including the VUV light. The heat treatment in this step is heat treatment for a resist film that has not been solidified, which is called PAB (Pre Applied Bake).

In step S04, after the heat treatment (PAB), an exposure process is performed on the workpiece W. In the exposure process, an exposure target portion of the resist film formed on the workpiece W is irradiated with an energy ray using a method such as immersion exposure or the like.

In step S05, after the exposure process, heat treatment is performed on the workpiece W. The heat treatment in this step is heat treatment for the resist film that has not been solidified, which is called PEB (Post Exposure Bake).

In step S06, after the heat treatment (PEB), a development process is performed on the workpiece W. In the development process, a developing solution is coated on the surface of the workpiece W and is then washed away with a rinsing solution. As a result, a predetermined pattern is formed on the surface of the workpiece W. After the development process, heat treatment (PB: Post Bake) may be performed again. The coating process, heat treatment (PAB and PEB), exposure process, and development process described in steps S01 and S03 to S06 can be performed by using, for example, a substrate processing system including a coating/developing apparatus and an exposure apparatus which are known in the art.

By performing the above series of processes, the exposure sensitivity of the resist film is further improved as compared with the conventional substrate processing method, and the roughness of the resist pattern after the exposure/development process is further improved.

[Evaluation Results]

With the above configuration, the light L1 from the light source 42, which is the weak light, can be uniformly applied to the surface of the workpiece W. The results of evaluation on this point are shown in FIGS. 8A to 8C.

Figure 8A:
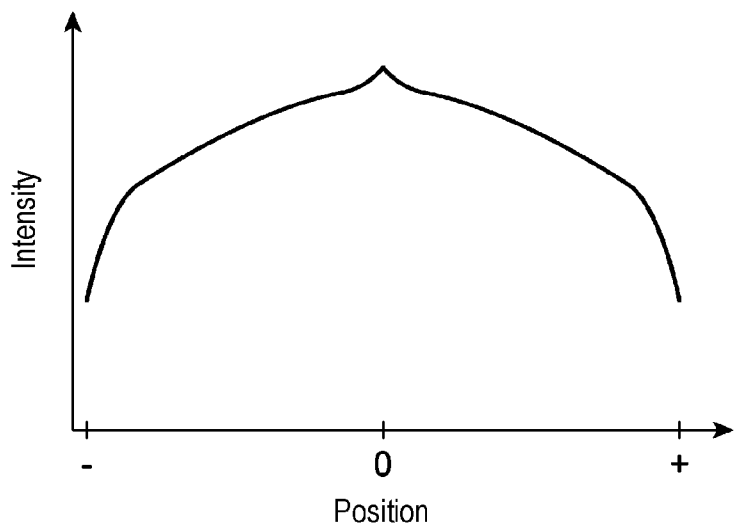
FIGS. 8A, 8B, and 8C are diagrams showing an example of an evaluation result of the distribution of light from a light source.
Figure 8B:
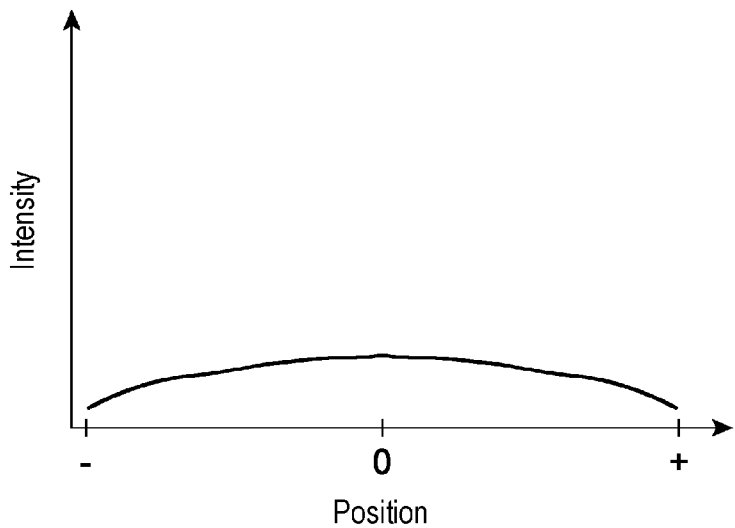
Figure 8C:
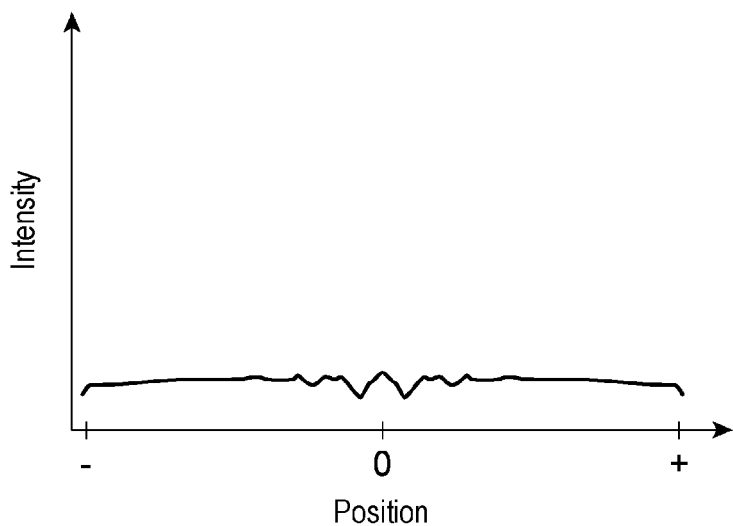

FIGS. 8A to 8C schematically show the results of evaluation on the distribution of the light L1 from the light source 42 on the surface of the workpiece W. In FIGS. 8A to 8C, the center of the workpiece W is set to position 0, and the outer peripheral portion (a portion corresponding to the peripheral edge Wp) of the workpiece W is indicated as "+" and "−."

FIG. 8A shows the distribution of the amount of light when the workpiece W was irradiated with the light without dimming using the perforated plate 52 in the substrate processing apparatus 1. Further, FIG. 8B shows the distribution of the amount of light when the perforated plate 52 having the aperture ratio of 10% was arranged as in the substrate processing apparatus 1. Further, FIG. 8C shows the distribution of the amount of light when the light-shielding plate 56 was used wherein the optical axis A2 of the light source 42 was positioned deviated from the center of the workpiece W (the axial line A1) as in the substrate processing apparatus 1A. In the example shown in FIG. 8C, the aperture ratio of the perforated plate 52 was 19%, and the shape of the aperture 56a in the light-shielding plate 56 was an isosceles triangular shape whose central portion is an apex angle, as shown in FIG. 4, which is substantially a regular triangular shape by setting the apex angle to 60°.

From the result of comparison between FIGS. 8A and 8B, it was confirmed that the amount of light could be significantly suppressed by providing the perforated plate 52. Further, by using the perforated plate 52, the unevenness of the amount of light between the central portion and the outer peripheral portion of the workpiece W was suppressed. However, also in the result shown in FIG. 8B, it was confirmed that the amount of light L1 received by the surface of the workpiece W was larger in the central portion than in the outer peripheral portion. In contrast, in FIG. 8C, it was confirmed that a difference in the amount of light L1 received by the surface of the workpiece W between the central portion and the outer peripheral portion of the workpiece W became small.

In this way, by using the perforated plate 52, the amount of light could be significantly suppressed. Further, it was confirmed that when irradiating the workpiece W while rotating the same, the workpiece W could be irradiated more uniformly with the light from the light source 42 (with the difference in the amount of light reduced) by adjusting the shape of the light-shielding plate.

[Operation]

According to the above-described substrate processing apparatus and substrate processing method, by using the perforated plate 52 that functions as a light amount suppressing member, the irradiation region AR on the substrate surface is irradiated with the light including vacuum ultraviolet light adjusted to weak light. Therefore, it is possible to appropriately adjust the sensitivity at the time of resist film exposure by irradiating the substrate surface with the light including the vacuum ultraviolet light which is the weak light. As a result, it is possible to make the sensitivity of the substrate at the time of exposure uniform in the plane of the substrate.

When irradiating the irradiation region AR on the substrate surface with the light including the vacuum ultraviolet light before the exposure, it may be required to irradiate the irradiation region AR with the light adjusted to the weak light. However, in order for a stable output of the light including the vacuum ultraviolet light from the light source 42, an output having a light amount increased to some degree is required. In order to reduce the amount of light that reaches the substrate, it is conceivable to increase a distance between the light source and the substrate. However, if the distance between the light source and the substrate is increased, it is necessary to increase the size (for example, the height) of the apparatus. In contrast, with the above configuration or the like, it is possible to irradiate the substrate with the light including the vacuum ultraviolet light in a state where the light amount is suppressed such that the light becomes the weak light by using the light amount suppressing member. Therefore, it is possible to appropriately adjust the sensitivity at the time of the exposure of the substrate while preventing the apparatus from becoming large in size.

Further, as in the above embodiment, the perforated plate 52 having the plurality of apertures 52a formed in the thickness direction may be used as the light amount suppressing member. In this case, it is possible to irradiate the substrate with the light including the vacuum ultraviolet light from the light source 42 as the weak light without changing its spectral component. Therefore, the sensitivity of the resist film can be appropriately adjusted by the light including vacuum ultraviolet light.

Further, the light amount suppressing member may include, for example, a member that suppresses the amount of light from the light source 42 such that the light becomes weak light and transmits the weak light, such as the light-transmitting plate 53. When such a light amount suppressing member is used, since it is possible to irradiate the substrate with the weak light while maintaining the distribution of light from the light source, the sensitivity of the resist film can be appropriately adjusted by the light including the vacuum ultraviolet light. That is, as compared with a configuration in which light can pass only through the apertures 52a as in the perforated plate 52, since a position through which the light can pass is not regulated, the bias of light can be reduced.

Further, in the substrate processing apparatus 1A, the light-shielding member is used as the light-shielding plate 56 which forms the irradiation region AR on the substrate surface which has the area smaller than the surface area of the substrate and which increases toward the outer peripheral side of the substrate. Then, the rotating substrate is irradiated with the light from the light source 42 after the irradiation region AR is adjusted via the light-shielding plate 56. With such a configuration, by adjusting the light-shielding plate 56, it is possible to more uniformly irradiate the entire substrate surface with the light from the light source 42. Therefore, the adjustment of the sensitivity of the resist film by the light including the vacuum ultraviolet light can be appropriately made on the substrate surface.

[Modifications]

Although various exemplary embodiments have been described above, various omissions, replacements, and changes may be made without being limited to the above-described exemplary embodiments. It is also possible to combine elements in different embodiments to form other embodiments.

Figure 9A:
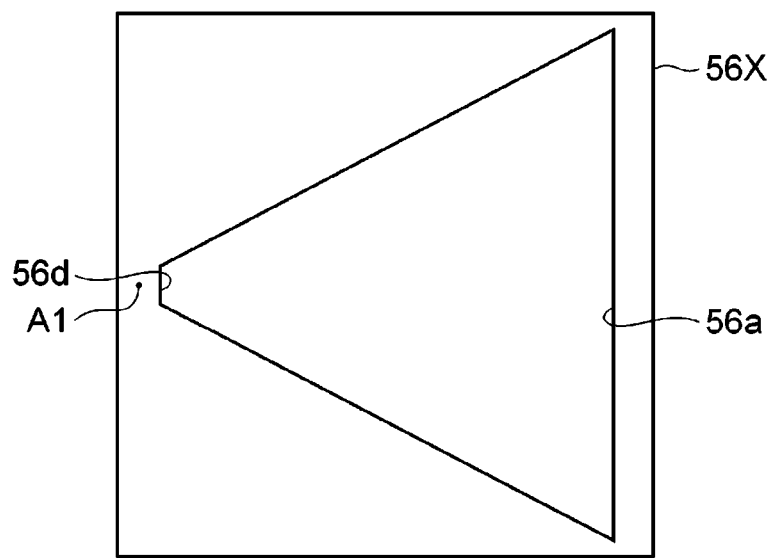

For example, the shape of the light-shielding plate as the light-shielding member can be changed as appropriate. FIGS. 9A to 9C show two types of modifications of the light-shielding plate.

A light-shielding plate 56X shown in FIG. 9A has a different shape of the aperture 56a as compared with that of the aperture 56a of the light-shielding plate 56. That is, the light-shielding plate 56X does not have the aperture 56a formed at a position overlapping the center of the workpiece W (a position corresponding to the axial line A1) in a plan view. As shown in FIGS. 1 and 3, the light from the light source 42 also diffuses below the light-shielding plates 54 and 56 as the light-shielding member. On the other hand, since the position of the center of the workpiece W hardly changes even when the workpiece W rotates, the amount of light L1 reaching the center of the workpiece W from the light source 42 may be larger than that around the center of the workpiece W. In contrast, by allowing that the aperture 56a of the light-shielding plate 56X is not formed at the position overlapping the center of the workpiece W in a plan view, it is possible to prevent the light from the light source 42 from concentrating at the center of the workpiece W. In the light-shielding plate 56X shown in FIG. 9A, the shape of the aperture 56a is not a triangle but a trapezoid so that the aperture 56a is not formed at the position overlapping the center of the workpiece W, but the shape of the aperture can be changed as appropriate. For example, the end portion of the aperture on the center side may be curved.

FIGS. 9B and 9C show a configuration of a light-shielding plate 56Y in which the amount of light passing through the light-shielding plate 56Y is adjusted at the central portion and the outer peripheral portion. The light-shielding plate 56Y has a perforated portion 5e in addition to the aperture 56a. Therefore, the light-shielding plate 56Y also has a function as a light amount suppressing member that adjusts the amount of light reaching the workpiece W to weak light. Further, similarly to the light-shielding plate 56X, the region of the aperture 56a is trapezoidal, and the perforated portion 56e is formed on the side corresponding to the central portion of the workpiece W. As a result, the light-shielding plate 56Y has a function of forming a gradient of the amount of light so that the irradiation intensity of light per unit area is increased.

When the rotating workpiece W is irradiated with the light from the light source 42, since the circumferential speed is smaller in the central portion than in the outer peripheral portion, the time period in which the workpiece W is irradiated with the light from the light source 42 tends to be longer. In contrast, when the gradient of the amount of light is formed so that the irradiation intensity of light per unit area becomes larger in the outer peripheral portion of the irradiation region AR than in the central portion thereof, a difference in the amount of light, which is derived from a difference in the circumferential speed, can be adjusted. Therefore, it is possible to irradiate the workpiece W with the light from the light source 42 in a state where the amount of light is more uniform.

In particular, for the light-shielding plate 56Y, when the perforated plate including the perforated portion having a plurality of apertures formed in the thickness direction is included in the light intensity suppressing member, by making the aperture ratio of the outer peripheral portion of the perforated plate larger than that of the central portion thereof, the gradient of the amount of light may be formed.

Although FIGS. 9A to 9C show an example in which the light-shielding plate 56Y is provided with the perforated portion 56e, by making the aperture ratio of the outer peripheral portion of the perforated plate 52 larger than that of the central portion thereof, the gradient of the amount of light may be formed so that the irradiation intensity of light per unit area increases.

As another modification, the light source may have the optical axis A2 inclined with respect to the substrate surface. When the optical axis A2 of the light source 42 is inclined with respect to the substrate surface, it is possible to irradiate the substrate surface with the light including vacuum ultraviolet light, which is the weak light, while decreasing the distance between the light source 42 and the substrate. For that reason, the sensitivity can be appropriately adjusted when the resist film is exposed. That is, the above configuration can be realized while reducing the height of the substrate processing apparatus.

Further, when the light source is inclined with respect to the substrate surface, the light amount distribution of the light from the light source 42 may change as compared with a case where the optical axis A2 is vertical. Therefore, the perforated plate 52, the light-transmitting plate 53, the light-shielding plate 54, and the like may be used to adjust the amount of light so as to have an appropriate distribution.

Further, in the above configuration, the perforated plate 52, the shutter 51, the light-transmitting plate 53, and the light-shielding plate 54 are arranged in this order between the light source 42 and the workpiece W, but the order can be changed as appropriate.

Further, although an example of the substrate processing method has been described above, for example, the order of the irradiation of VUV light (S02) and the heat treatment (S03) may be changed. Further, the heat treatment (S03) itself before the exposure may not be performed.

According to the present disclosure in some embodiments, there is provided a technique capable of making the sensitivity at the time of exposure of a substrate using a resist material suitable for EUV lithography uniform in the plane of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a light source configured to irradiate a substrate having thereon a resist film made of a resist material for EUV lithography with light including vacuum ultraviolet light before an exposure process;
a light amount suppressing member provided in an optical path of the light from the light source and configured to suppress an amount of the light reaching a surface of the substrate such that the light becomes weak light as a whole in an irradiation region; and
a shutter disposed between the light source and the substrate and configured to switch between a state in which the light from the light source reaches the substrate and a state in which the light does not reach the substrate,
wherein the light including the vacuum ultraviolet light contains a continuous spectral component of at least a portion of a band contained in a wavelength of 10 nm to 200 nm,
wherein the light amount suppressing member includes a perforated plate which has a plurality of apertures formed in a thickness direction within an irradiation range of the light from the light source, and
wherein the perforated plate is disposed between the light source and the shutter.

2. The substrate processing apparatus of claim 1, wherein the light amount suppressing member includes a member that suppresses the amount of the light from the light source such that the light becomes the weak light and transmits the weak light.

3. The substrate processing apparatus of claim 1, further comprising:

a substrate support part configured to support the substrate while rotating the substrate when irradiating the substrate with the light from the light source; and
a light-shielding member provided at a position between the light source and the substrate and configured to form the irradiation region on the surface of the substrate such that the irradiation region has an area smaller than a surface area of the substrate and increases toward an outer peripheral side of the substrate.

4. The substrate processing apparatus of claim 3, wherein the light amount suppressing member forms a gradient of light amount so that irradiation intensity of the light per unit area becomes larger in an outer peripheral portion than a central portion in the irradiation region.

5. The substrate processing apparatus of claim 4, wherein the gradient of the light amount is formed by making an aperture ratio of the outer peripheral portion larger than an aperture ratio of the central portion.

6. The substrate processing apparatus of claim 3, wherein the light-shielding member has no aperture formed at a position overlapping a center of the substrate in a plan view.

7. The substrate processing apparatus of claim 1, wherein the light source has an optical axis inclined with respect to the surface of the substrate.

8. A method of processing a substrate, comprising:
irradiating the substrate having thereon a resist film made of a resist material for EUV lithography with light including vacuum ultraviolet light from a light source before an exposure process; and
suppressing an amount of the light reaching a surface of the substrate such that the light becomes weak light as a whole in an irradiation region by a light amount suppressing member provided in an optical path of the light from the light source in the irradiating the substrate,
wherein the light including the vacuum ultraviolet light contains a continuous spectral component of at least a portion of a band contained in a wavelength of 10 nm to 200 nm,
wherein the light amount suppressing member includes a perforated plate which has a plurality of apertures formed in a thickness direction within an irradiation range of the light from the light source,
wherein a shutter is disposed between the light source and the substrate and configured to switch between a state in which the light from the light source reaches the substrate and a state in which the light does not reach the substrate, and
wherein the perforated plate is disposed between the light source and the shutter.

9. The method of claim 8, further comprising:
supporting the substrate while rotating the substrate in the irradiating the substrate; and
forming, on the surface of the substrate, the irradiation region having an area smaller than a surface area of the substrate and increasing toward an outer peripheral side of the substrate, by a light-shielding member provided at a position between the light source and the substrate, in the irradiating the substrate.

* * * * *